(12) United States Patent
Chiang et al.

(10) Patent No.: US 7,495,440 B2
(45) Date of Patent: Feb. 24, 2009

(54) Q-SPACE SAMPLING METHOD AND DIFFUSION SPECTRUM IMAGING METHOD EMPLOYING THE SAME

(75) Inventors: Wen-Yang Chiang, Taipei (TW); Wen-Yih Isaac Tseng, 6th Fl., No. 3, Alley 2, Lane 345, Sec. 4, Jen-Ai Rd., Taipei (TW); Ming-Hwei Perng, Hsinchu (TW)

(73) Assignee: Wen-Yih Isaac Tseng, Taipei (TW)

( * ) Notice: Subject to any disclaimer, the term of this patent is extended or adjusted under 35 U.S.C. 154(b) by 21 days.

(21) Appl. No.: 11/743,751

(22) Filed: May 3, 2007

(65) Prior Publication Data

US 2008/0272781 A1 Nov. 6, 2008

(51) Int. Cl.
*G01V 3/00* (2006.01)
(52) U.S. Cl. .................................. 324/309; 324/307
(58) Field of Classification Search ......... 324/300–322; 600/410
See application file for complete search history.

(56) References Cited

U.S. PATENT DOCUMENTS 6,522,786 B1 * 2/2003 Cline .......................... 382/257
6,614,226 B2 * 9/2003 Wedeen ...................... 324/309
7,034,531 B1 * 4/2006 Tuch et al. .................. 324/309

OTHER PUBLICATIONS

T. Theussl, Optimal Regular Volume Sampling, Proceeding of the IEEE Visualization Conference, San Diego, CA., USA, pp. 91-98, 2001.
L.W. Kuo et al., Using Track Similarity to Determine Optimum Sequence Parameters for Diffusion Spectrum Imaging, 13th Annual Meetings of ISMRM, Miami Beach, FL., USA, 2005.
D. A. Feinberg et al., Simultaneous Echo Refocus in EPI, Magnetic Resonance in Medicine, vol. 48, (1), pp. 1-5, 2002.
T. G. Reese et al., Halving Imaging Time of Whole Brain Diffusion Spectrum Imaging (DSI) Using Simultaneous Echo Refocusing (SER) EPI, 14th Annual Meetings of ISMRM, Seattle, WA., 2006.
K. Afranakis et al., k-Space Understanding in Propeller Imaging, Magnetic Resonance in Medicine, vol. 53, (3), pp. 675-683, 2005.
W-Y. Chiang et al., Diffusion Spectrum Imaging Using Body-Center-Cubic Sampling Scheme, 14th Annual Meetings of ISMRM, Seattle, WA., 2006.

* cited by examiner

*Primary Examiner*—Brij B Shrivastav
(74) *Attorney, Agent, or Firm*—Ladas & Parry LLP

(57) ABSTRACT

A q-space sampling method includes: (a) receiving a required sampling number and a range of sampling region in q-space set by a user; (b) obtaining a sampling interval by iteration using a regular non-rectangular sampling lattice when an actual sampling number converges to the required sampling number; and (c) obtaining positions of sampling data in q-space based on the sampling interval and the regular non-rectangular sampling lattice. A diffusion spectrum imaging method using the q-space sampling method is also disclosed.

19 Claims, 5 Drawing Sheets

Q-SPACE SAMPLING METHOD AND DIFFUSION SPECTRUM IMAGING METHOD EMPLOYING THE SAME

BACKGROUND OF THE INVENTION

1. Field of the Invention

The invention relates to a magnetic resonance (MR) technique, more particularly to a q-space sampling method and a diffusion spectrum imaging method employing the sampling method.

2. Description of the Related Art

Diffusion spectrum imaging (hereinafter referred to as DSI) is an extended application of magnetic resonance (MR) techniques, and can be used to obtain information of tissue fibers non-invasively.

Conventional DSI techniques mainly include the following steps:

(a) First-stage sampling: Using a series of RF pulses and magnetic gradients, the spatial information of tissue can be distinguished via this spatial encoding procedure. This stage of sampling is considered as structural-image sampling;

(b) Second-stage sampling: In addition to spatial encoding, diffusion-weighted magnetic gradient (diffusion gradient for short) is applied. Because this step may add the information of water molecular motion to the imaged tissue, the applied diffusion gradients are considered as diffusion encodings. With these two stages of encodings, a structural image may be enhanced by diffusion-weighted contrast, and this kind of image is called diffusion weighted image (DWI). With different diffusion gradients, the contrasts of DWIs differ. Such is referred to as q-space sampling; and (c) Signal processing: Since different directions and intensities of the diffusion gradients stand for different coordinates in a three-dimensional q-space, different DWIs with corresponding spatial position are arranged in one q-space according to originally designed q-space positions. After arranging these DWIs into q-space, inverse Fourier transform is applied to the q-space sampling data so as to reconstruct a probability density function (PDF) of water molecular motion, and orientation distribution functions of PDF are calculated using radial integrations. Information of the tissue fibers can be obtained by analyzing these orientation distribution functions.

One setback of DSI techniques is the low speed of sampling. According to a paper entitled "Using Track Similarity to Determine Optimum Sequence Parameters for Diffusion Spectrum Imaging" by L-W. Kuo et al. in *Proceedings of the 13th Annual Meeting of ISMRM*, Miami Beach, Fla., USA, 2005, the optimum parameter for DSI clinically is a setting of 515 diffusion-encoding gradients, and the maximum value of radius b of the sampled range of q-space is set as bmax=6000 s/mm$^2$. However, under such optimum parameter settings, it takes more than an hour to obtain the sampled data in q-space. Long acquisition time is very disadvantageous in clinical applications.

There are two conventional ways of improving DSI sampling speed. One approach is to improve the sampling speed at the first stage, i.e., carrying out the first stage in image space. The other approach is to improve the sampling speed at the second stage, i.e., carrying out the second stage in q-space.

For conventional schemes to improve the sampling speed at the first stage in image space, reference can be made to the article entitled "k-space undersampling in PROPELLER imaging" by K. Arfanakis et al. in *Magnetic Resonance in Medicine*, vol. 53, (3), pp. 675-83, March, 2005. The scheme proposed in that article is mainly the use of k-space undersampling in PROPELLER MRI, and can reduce about 50% of sampling time when sampling DWIs. However, co-registration is additionally required in this conventional scheme.

For conventional schemes to improve the sampling speed at the first stage in image space, reference can be made to the article entitled "Simultaneous echo refocusing in EPI" by D.A. Feinberg et al. in *Magnetic Resonance in Medicine*, vol. 48, (1), pp. 1-5, 2002 and the paper entitled "Halving imaging time of whole brain diffusion spectrum imaging (DSI) using simultaneous echo refocusing (SER) EPI" by T. G. Reese et al. in *Proceedings of the 14th Annual Meeting of ISMRM*, Seattle, Wash., 2006. The methods proposed in these papers employ simultaneous echo refocusing (SER) so that two or more DWIs can be obtained in one echo train, thereby reducing data acquisition time. However, the SER method will reduce the quality of DWIs.

Another conventional scheme of improving the sampling speed at the first stage in image space is described in "Optimal Regular Volume Sampling" by T. Theussl in *Proceedings of the IEEE visualization Conference*, San Diego, Calif., USA, pp. 91-98, 2001. This paper points out that, in image space, use of body-center cubic sampling lattice or face-center cubic sampling lattice to sample computer tomography (CT) images or magnetic resonance images (MRI) can better prevent aliasing of structural images than rectangular sampling lattice (also known as Cartesian sampling lattice), and, therefore, similar image quality can be obtained using a smaller sampling number, so that sampling efficiency is enhanced. The rectangular sampling lattice, the body-center cubic sampling lattice and the face-center sampling lattice, as well as the respective generating matrices thereof are shown in FIG. 1.

However, the abovementioned conventional schemes are carried out in a structural image space, and are intended to improve the sampling speed at the first stage of DSI technique. They do not provide any improvement with regard to the speed of sampling in q-space at the second stage. Moreover, it is noted that, under current fast imaging techniques, sampling of structural images at the first stage takes up only a small portion of the time for the DSI sampling process. Therefore, the DSI sampling speed depends heavily on the sampling speed at the second stage. Thus, the three conventional schemes mentioned above still cannot effectively improve the DSI sampling speed.

However, the time required for generating contrast in DWIs by means of diffusion gradient magnetic field is constrained by the diffusion speed of water molecules physically, so that the speed of q-space sampling at the second stage is not easy to increase. A conventional method used to improve the speed of q-space sampling at the second stage is to reduce the sampling number in q-space in a fixed q-space sampling range (See "Using Track Similarity to Determine Optimum Sequence Parameters for Diffusion Spectrum Imaging" by L-W. Kuo et al. in *Proceedings of the 13th Annual Meeting of ISMRM*, Miami Beach, Fla., USA, 2005). Yet, the conventional method of q-space sampling is generally based on rectangular sampling lattice, and does not optimize the sampling lattice, so that erroneous identification of signals easily occurs as a result of aliasing. The increase in sampling speed is thus limited.

SUMMARY OF THE INVENTION

Therefore, an object of the present invention is to provide a diffusion spectrum imaging method that can enhance sampling efficiency.

Accordingly, the diffusion spectrum imaging method of the present invention includes the following steps:

(A) obtaining a plurality of positions of sampling data in q-space using a regular non-rectangular sampling lattice in q-space to thereby obtain a series of diffusion weighted magnetic resonance images; and (B) arranging the series of diffusion weighted magnetic resonance images obtained in step (A) in q-space according to the regular non-rectangular sampling lattice for processing so as to obtain a probability density function.

Another object of the present invention is to provide a q-space sampling method that can enhance sampling efficiency.

Accordingly, the q-space sampling method of the present invention includes the following steps:

(a) receiving a required sampling number and a range of sampling region in q-space set by a user;

(b) obtaining a sampling interval by iteration using a regular non-rectangular sampling lattice when an actual sampling number converges to the required sampling number; and (c) obtaining positions of sampling data in q-space based on the sampling interval and the regular non-rectangular sampling lattice.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

First Preferred Embodiment

Figure 1:
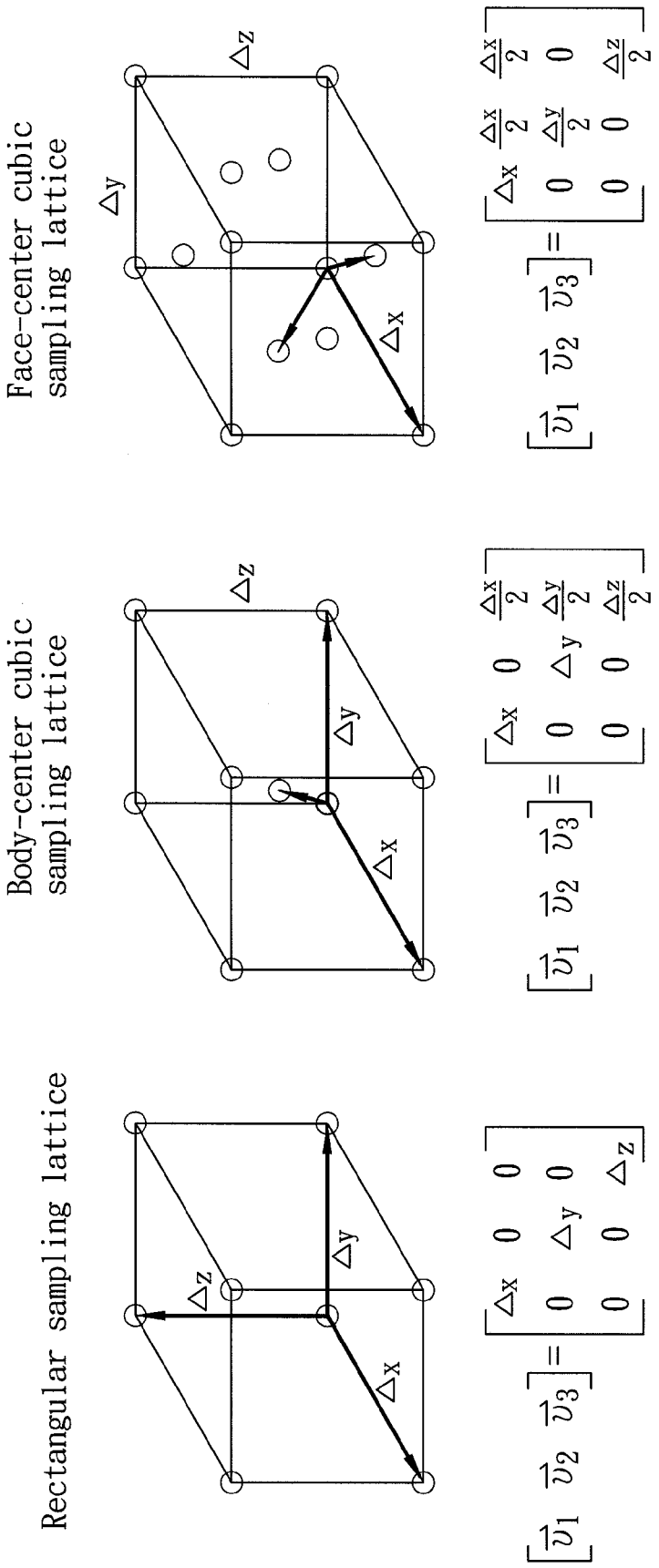
FIG. 1 is a schematic diagram to illustrate a rectangular sampling lattice, a body-center cubic sampling lattice and a face-center cubic sampling lattice, and respective generating matrices thereof.
Figure 2:
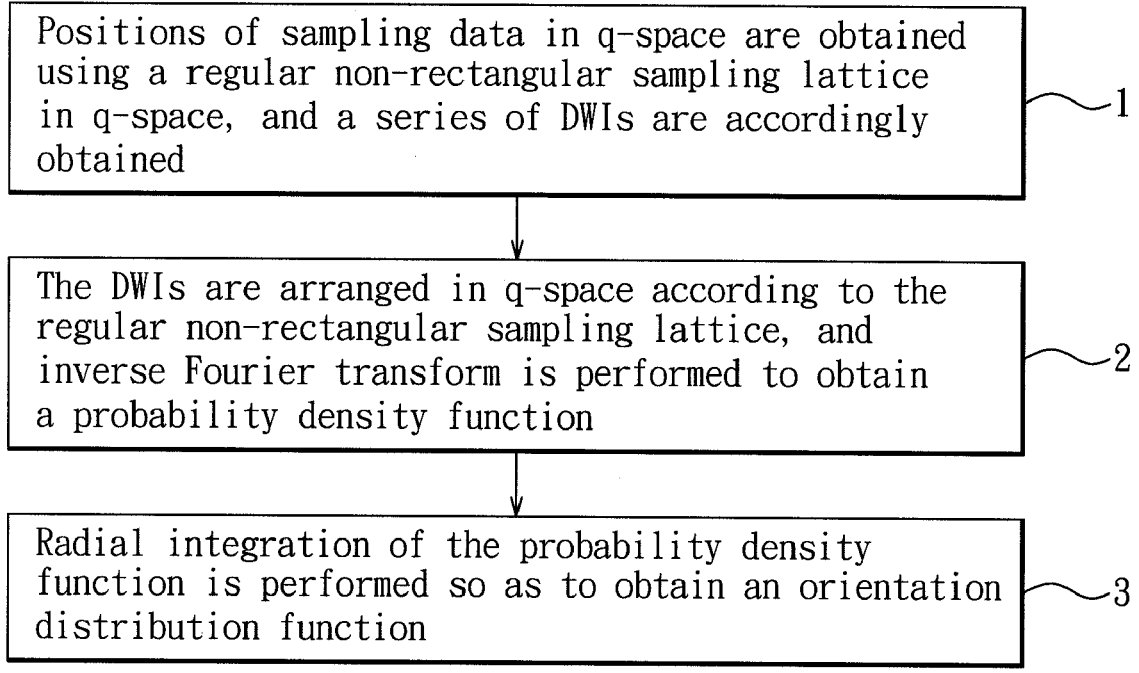
FIG. 2 is a flowchart to illustrate the first preferred embodiment of a diffusion spectrum imaging method according to the present invention.

Referring to FIG. 2, the first preferred embodiment of a diffusion spectrum imaging method according to the present invention includes the following steps:

In step 1, positions of sampling data in q-space are obtained using a regular non-rectangular sampling lattice in q-space, and a series of DWIs are accordingly obtained. The term "regular" means that the positions of sampling points on the lattice can be represented using a generating matrix of an integer period. The generating matrix is a square matrix. Its column vector represents repetition directions and distances of sampling points in a three-dimensional space, and length of the column vector is a unit sampling interval. As for the term "non-rectangular," it refers to a non-Cartesian sampling lattice. The regular non-rectangular sampling lattice includes a body-center cubic sampling lattice and a face-center cubic sampling lattice, but is not limited thereto.

In step 2, the DWIs in step 1 are arranged in q-space according to the regular non-rectangular sampling lattice, and inverse Fourier transform is applied to q-space sampling data to obtain a probability density function of water molecular motion.

In step 3, radial integration of the probability density function obtained in step 2 is performed so as to obtain an orientation distribution function.

Figure 3:
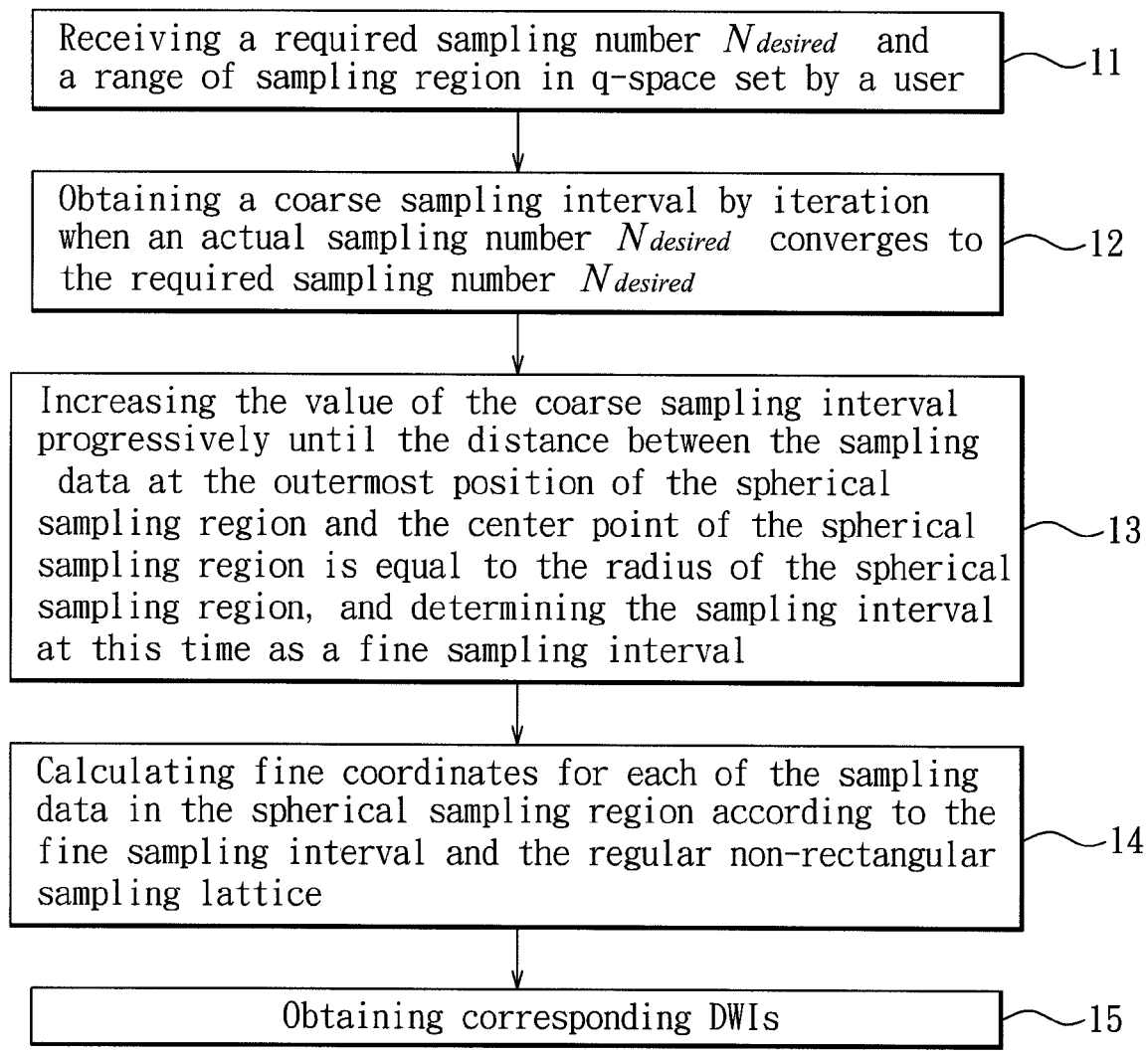
FIG. 3 is a flowchart to illustrate sub-steps of step 1 in the first preferred embodiment.

Referring to FIG. 3, it is noted that step 1 includes the following sub-steps 11-14 of sampling.

In sub-step 11, a required sampling number $N_{desired}$ and a range of sampling region in q-space set by the user are received. In this embodiment, the sampling region is a spherical sampling region. Therefore, a radius of the spherical sampling region set by the user is received in sub-step 11.

In sub-step 12, under the regular non-rectangular sampling lattice, the unit sampling interval is approximately in inverse proportion to the cubic root of the sampling number within the spherical sampling region. Therefore, according to the following equation, iteration is performed to obtain a coarse sampling interval when an actual sampling number $N_{inside}$ converges to a value around the required sampling number $N_{desired}$, and the coarse sampling interval is one unit sampling interval of the regular non-rectangular sampling lattice:

$$d(n+1) = d(n) \times \left(\frac{N_{inside}(n)}{N_{desired}}\right)^{1/3}$$

where $d(n)$ and $d(n+1)$ are respectively sampling intervals during the $n^{th}$ and $n+1^{th}$ iterations and $N_{inside}(n)$ is the actual sampling number during the $n^{th}$ iteration.

In sub-step 13, the value of the coarse sampling interval is increased progressively until the distance between the sampling data at the outermost position of the spherical sampling region and the center point of the spherical sampling region is equal to the radius set in sub-step 11. The sampling interval at this time is determined as a fine sampling interval.

In sub-step 14, fine coordinates in q-space are calculated for each of the sampling data in the spherical sampling region according to the fine sampling interval and the regular non-rectangular sampling lattice.

In sub-step 15, the fine coordinates are inputted into an MR scanner. The MR scanner sets a diffusion encoding gradient that corresponds to each of the fine coordinates according to the inputted fine coordinates so as to obtain the series of DWIs. Since this sub-step belongs to the prior art and is not a crucial feature of the present invention, it will not be described in more detail for the sake of brevity.

Second Preferred Embodiment

The second preferred embodiment of a diffusion spectrum imaging method according to the present invention is similar to the first preferred embodiment except that sub-steps 13' and sub-step 14' in the second preferred embodiment are different from those in the first preferred embodiment.

In sub-step 13', coarse coordinates in q-space are calculated for each of the sampling data in the spherical sampling region according to the coarse sampling interval obtained in sub-step 12 and the regular non-rectangular sampling lattice.

In sub-step 14', the coarse coordinates obtained in sub-step 13' are multiplied by a ratio (=a/r) so as to obtain fine coordinates, in which a is the distance between the position of the outermost sampling data in the spherical sampling region and the center point of the spherical sampling region in sub-step 13', and r is the radius set in sub-step 11.

Experiment Results

In order to verify that the use of the regular non-rectangular sampling lattice in q-space sampling in the embodiments of the present invention can achieve a higher sampling efficiency over use of a rectangular sampling lattice, sampling efficiencies of an experiment set (i.e., the body-center cubic sampling lattice used in the first preferred embodiment) and a control set (i.e., the rectangular sampling lattice) were compared.

In order to accurately determine the sampling efficiency, three Tesla MR scanners (Trio, Siemens) were used, and a twice-refocused balanced echo diffusion EPI sequence was used to acquire 515 DWIs to serve as a standard set. The set parameters were: 515 isotropic diffusion encoding gradients; radius of the spherical sampling region=6000 s/mm$^2$; and TR/TE=2900/150 ms. Besides, a rectangular sampling lattice was used, and isotropic voxels were obtained with an image resolution set at 2.7 mm. 40 slices of the middle portion of a brain were acquired.

The sampling numbers in q-space for the experiment set and the control set were reduced by approximately 34% in relation to the standard set, and the sampling numbers for the experiment set and the control set were made to be as close as possible so as to allow comparison of differences between the experiment and control sets and the standard set.

Therefore, the sampling number for the control set was 341, and DWIs of the control set were obtained through interpolation from the DWIs in the standard set after obtaining the sampling coordinates of the control set.

The radius of the spherical sampling region in the experiment set was 6000 s/mm$^2$, and the required sampling number $N_{desired}$ approximated 341, so that 341, 340, 342, etc., could be set. The actual sampling number $N_{inside}$ obtained according to the process described in the first preferred embodiment was 339, which was less than that of the control set by 2. Similarly, after obtaining the sampling coordinates according to the process described in the first preferred embodiment, DWIs of the experiment set were obtained through interpolation from the DWIs in the standard set.

After obtaining the DWIs of the control set and the experiment set, Hamming filter and spherical windowing function were respectively applied to the DWIs of the control and experiment sets so as to reduce folding of signals caused by aliasing so that the DWIs enter into the field of view (FOV).

Inverse Fourier transform was subsequently applied to the processed signals, respectively, so as to obtain the probability density function of water molecular motion, which was further processed to obtain orientation distribution functions.

Thereafter, by obtaining mean angular differences between the control set and the standard set and between the experiment set and the standard set, differences between the orientation distribution functions of the control set and the standard set and between the orientation distribution functions of the experiment set and the standard set could be determined.

Figure 4:
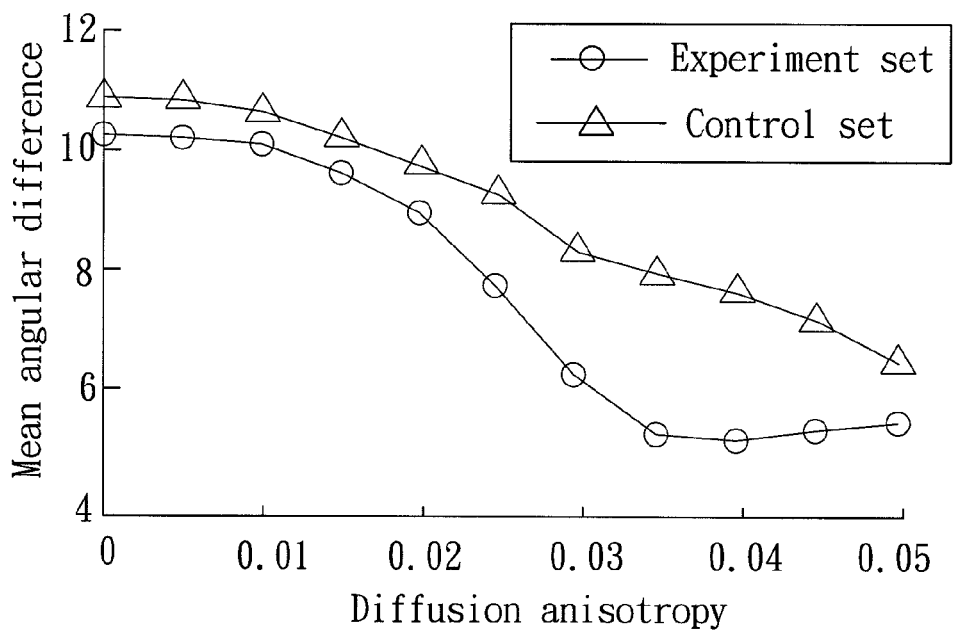
FIG. 4 is a plot to illustrate mean angular differences between a control set and a standard set and between an experiment set and the standard set under different diffusion anisotropies.
Figure 5:
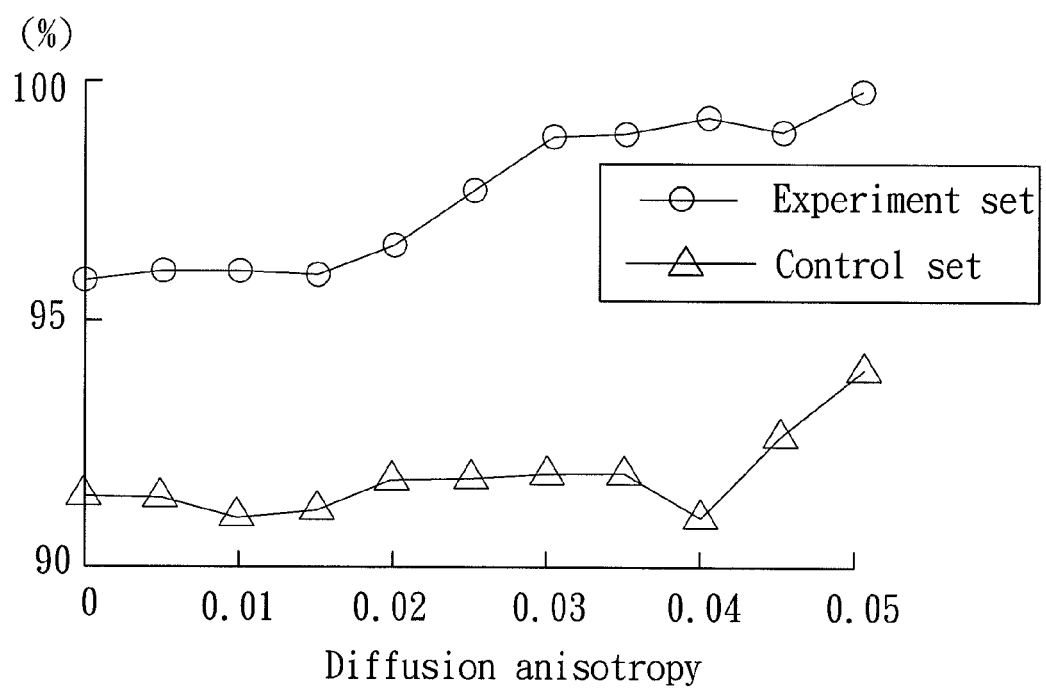
FIG. 5 is a plot to illustrate unit volumes of the control set and the experiment set when the angular differences were within 20° under different diffusion anisotropies.

Referring of FIG. 4, it can be observed that, when brain positions with diffusion anisotropy (DA) higher than 0.035 were considered, the mean angular difference between the control set and the standard set and that between the experiment set and the standard set were 8.1° and 5.4°, respectively. Furthermore, referring to FIG. 5, when brain positions with angular differences within 20° were considered, unit volumes of the control set and the experiment set were 92.06% and 99.07%, respectively. If the mean angular difference is small or the angular difference is within 20°, the unit volume is large, indicating that the orientation distribution function of that set is closer to the orientation distribution function of the standard set, and that the sampling quality is better and the sampling efficiency is higher. This also indicates that the actual required sampling number may be reduced, thereby further shortening the sampling time.

Figure 6:
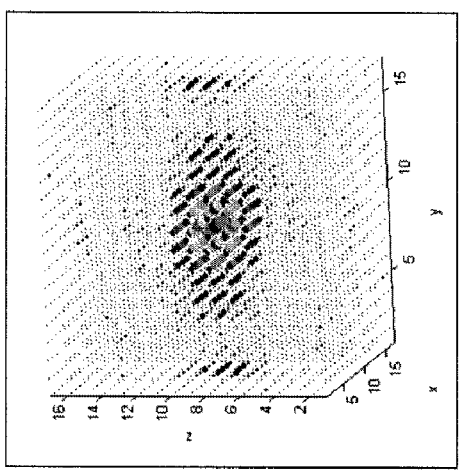
FIG. 6 is a schematic diagram to illustrate probability density functions of the standard set, the experiment set and the control set.
Figure 6:
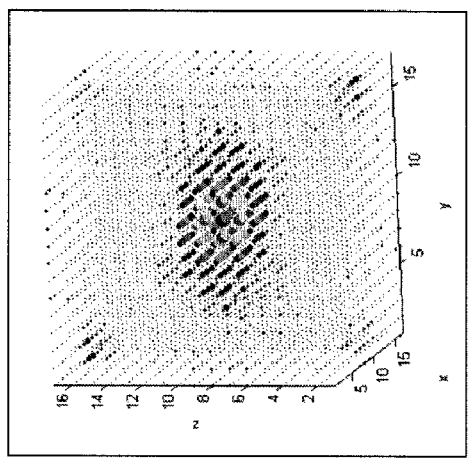
Figure 6:
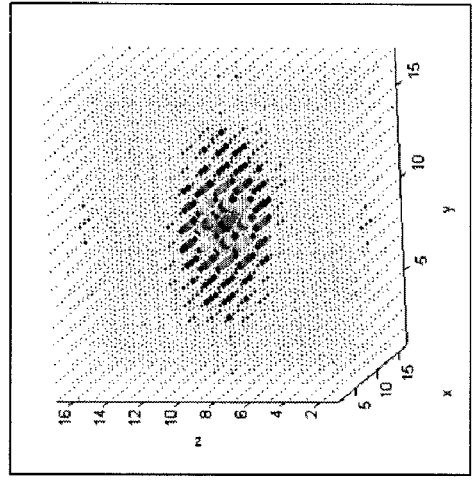

In addition, referring to FIG. 6, if the spherical windowing function is not applied to DWIs in the experiment set and the control set, repeated patterns generated as a result of aliasing of the probability density function of the experiment set will be located at corners of the field of view, and will not affect identification of the patterns. In the control set, since all the repeated patterns are not located at the corners, identification of the patterns will be affected. In the experiment set, if the spherical windowing function is used for filtering at the outset, the repeated patterns at the corners can be completely removed. However, in the control set, use of the spherical windowing function still cannot remove the repeated patterns.

In sum, in the preferred embodiments of this invention, optimum sampling data positions in q-space are directly obtained at the outset. A series of required DWIs are subsequently obtained according to these positions. In the embodiments, the optimum sampling data are obtained in q-space based on a regular non-rectangular sampling lattice. Therefore, under the same sampling number, there will be better sampling quality. In other words, the present invention can employ a larger sampling interval so that the required sampling number can be smaller compared to the prior art to thereby achieve a shorter sampling time.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A diffusion spectrum imaging, method, comprising the following steps:
   (A) obtaining a plurality of positions of sampling data in q-space using a regular non-rectangular sampling lattice in q-space to thereby obtain a series of diffusion weighted magnetic resonance images; and
   (B) arranging the series of diffusion weighted magnetic resonance images obtained in step (A) in q-space according to the regular non-rectangular sampling lattice for processing so as to obtain a probability density function;
   wherein step(A) includes the following sub-steps:
   (A-1) receiving a required sampling number and a range of sampling region in q-space set by a user;
   (A-2) obtaining a sampling interval by iteration using the regular non-rectangular sampling lattice when an actual sampling number converges to the required sampling number; and
   (A-3) obtaining the positions of the sampling data in q-space based on the sampling interval and the regular non-rectangular sampling lattice.

2. The diffusion spectrum imaging method according to claim 1, wherein the regular non-rectangular sampling lattice includes a body-center cubic sampling lattice.

3. The diffusion spectrum imaging method according to claim 1, wherein the regular non-rectangular sampling lattice includes a face-center cubic sampling lattice.

4. The diffusion spectrum imaging method according to claim 1, further comprising a step (C) of processing the probability density function obtained in step (B) so as to obtain an orientation distribution function.

5. The diffusion spectrum imaging method according to claim 1, wherein, in step (B), inverse Fourier transform is applied to the series of diffusion weighted magnetic resonance images obtained in step (A) so as to obtain the probability density function.

6. The diffusion spectrum imaging method of claim 1, wherein, in step (B), a spherical windowing function is applied to the series of diffusion weighted magnetic resonance images obtained in step (A) for filtering before applying inverse Fourier transform thereto so as to obtain the probability density function.

7. The diffusion spectrum imaging method of claim 1, wherein the sampling region is a spherical sampling region, and in sub-step (A-1), a radius of the spherical sampling region set by the user is further received.

8. The diffusion spectrum imaging method of claim 7, wherein, in sub-step (A-3), coordinates of each of the sampling data in q-space are calculated based on the sampling interval obtained in sub-step (A-2) and the regular non-rectangular. sampling lattice, each of the coordinates being multiplied by a ratio to obtain fine coordinates, the ratio being calculated by dividing a distance between outermost sampling data in the spherical sampling region and a center point of the spherical sampling region by the radius of the spherical sampling region under the sampling interval in sub-step (A-2).

9. The diffusion spectrum imaging method of claim 7, wherein, between sub-steps (A-2) and (A-3), step (A) further includes a sub-step of progressively increasing value of the sampling interval obtained in sub-step (A-2) until value of a distance between outermost sampling data in the spherical sampling region and a center point of the spherical sampling region is equal to the radius of the spherical sampling region, the value serving as an updated sampling interval.

10. The diffusion spectrum imaging method of claim 9, wherein, in sub-step (A-3), coordinates of each of the sampling data in q-space are calculated according to the updated sampling interval and the regular non-rectangular sampling lattice.

11. The diffusion spectrum imaging method of claim 1, wherein the iteration in sub-step (A-2) is based on the following equation:

$$d(n+1) = d(n) \times \left(\frac{N_{inside}(n)}{N_{desired}}\right)^{1/3},$$

where $d(n)$ and $d(n+1)$ are respectively sampling intervals during the $n^{th}$ and $n+1^{th}$ iterations; $N_{inside}(n)$ is the actual sampling number during the $n^{th}$ iteration, and a unit sampling interval of the regular non-rectangular sampling lattice is in inverse proportion to a cubic root of the sampling number.

12. A q-space sampling method adapted for use in a diffusion spectrum imaging method, the sampling method comprising the following steps:
(a) receiving a required sampling number and a range of sampling region in q-space set by a user;
(b) obtaining a sampling interval by iteration using a regular non-rectangular sampling lattice when an actual sampling number converges to the required sampling number, and
(c) obtaining positions of sampling data in q-space based on the sampling interval and the regular non-rectangular sampling lattice.

13. The q-space sampling method of claim 12, wherein the sampling region is a spherical sampling region, and in step (a), a radius of the spherical sampling region set by the user is further received.

14. The q-space sampling method of claim 13, wherein in step (c), coordinates of each of the sampling data in q-space are calculated based on the sampling interval obtained in step (b) and the regular non-rectangular sampling lattice, each of the coordinates being multiplied by a ratio to obtain fine coordinates, the ratio being calculated by dividing a distance between outermost sampling data in the spherical sampling region and a center point of the spherical sampling region by the radius of the spherical sampling region under the sampling interval in step (b).

15. The q-space sampling method of claim 13, further comprising, between steps (b) and (c), a step of progressively increasing value of the sampling interval obtained in step (b) until value of a distance between outermost sampling data in the spherical sampling region and a center point of the spherical sampling region is equal to the radius of the spherical sampling region, the value serving as an updated sampling interval.

16. The q-space sampling method of claim 15, wherein, in step (c), coordinates of each of the sampling data in q-space are calculated according to the updated sampling interval and the regular non-rectangular sampling lattice.

17. The q-space sampling method of claim 12, wherein the iteration in sub-step (b) is based on the following equation:

$$d(n+1) = d(n) \times \left(\frac{N_{inside}(n)}{N_{desired}}\right)^{1/3},$$

where $d(n)$ and $d(n+1)$ are respectively sampling intervals during the $n^{th}$ and $n+1^{th}$ iterations, $N_{inside}(n)$ is the actual sampling number during the $n^{th}$ iteration, and a unit sampling interval of the regular non-rectangular sampling lattice is in inverse proportion to a cubic root of the sampling number.

18. The q-space sampling method of claim 12, wherein the regular non-rectangular sampling lattice includes a body-center cubic sampling lattice.

19. The q-space sampling method of claim 12, wherein the regular non-rectangular sampling lattice includes a face-center cubic sampling lattice.

* * * * *